United States Patent [19]

Efendovich et al.

[11] Patent Number: 5,218,314

[45] Date of Patent: Jun. 8, 1993

[54] HIGH RESOLUTION, MULTI-FREQUENCY DIGITAL PHASE-LOCKED LOOP

[75] Inventors: Avner Efendovich, Tel-Aviv; Afek Yachin, Kfar Saba; Amos Intrater, Nathania; Zohar Peleg, Ramat-Gan; Coby Sella, Haifa; Zeev Bikowsky, Nathania, all of Israel

[73] Assignee: National Semiconductor Corporation, Santa Clara, Calif.

[21] Appl. No.: 890,691

[22] Filed: May 29, 1992

[51] Int. Cl.⁵ .................. H03K 5/13; H03K 5/22; H03L 7/00

[52] U.S. Cl. .................. 328/155; 331/25; 375/120

[58] Field of Search .............. 328/155; 329/325; 331/25, DIG. 2; 332/127, 128; 375/120

[56] References Cited

U.S. PATENT DOCUMENTS 4,868,514 9/1989 Azevedo et al. ............ 331/25
5,095,233 3/1992 Ashby et al. ............ 331/DIG. 2

Primary Examiner—John D. Lee
Assistant Examiner—Robert E. Wise
Attorney, Agent, or Firm—Limbach & Limbach

[57] ABSTRACT

The present invention provides a phase-locked loop in which an internal oscillator is fed into a high resolution tapped delay line. One output of the tapped delay line is selected by selection logic to generate the output clock. The output clock is phase compared with the input signal, which is either a clock signal or a NRZ data signal, and in any case, is a signal with frequency that is a division by two of the frequency of the internal oscillator and the source of which is also the internal oscillator. Then a decision is made, according to the phase detection, whether to select the next output of the delay line, the previous one, or remain with the current one. Therefore, if a change in the frequency is needed, then if an integer multiple or division of the original frequency is selected for the internal oscillator, synchronization will be unchanged, and furthermore, both the output clock and the input signal will simultaneously switch to the new frequency. All this is done by additional logic that enables actual switching to the new frequency only after an entire cycle of the low frequency has ended.

6 Claims, 4 Drawing Sheets

HIGH RESOLUTION, MULTI-FREQUENCY DIGITAL PHASE-LOCKED LOOP

BACKGROUND OF THE INVENTION

1. Field of the Invention

The present invention relates to phase-locked loops (PLL) and, in particular, to a digital phase-locked loop that utilizes a high resolution tapped delay line to synchronize a generated clock signal to an external clock.

2. Discussion of the Prior Art

A phase-locked loop (PLL) is a circuit that generates a periodic signal that is synchronized to an external clock. Most PLLs include an internal oscillator circuit that operates at a frequency much higher than that of the external clock. A phase detector circuit identifies the direction and extent of the phase error between the internally generated clock and the external clock. An adjustment unit then utilizes the phase error to control the phase of the generated clock.

In some PLLs, phase adjustment is accomplished utilizing a voltage controlled oscillator (VCO), i.e. by controlling the frequency and phase of the generated clock signal utilizing voltage (or voltage that is converted to current). In a partial digital PLL, the phase detector is digital, while phase control is performed by a VCO. In an all-digital PLL, phase control is accomplished in one of the following ways: (1) a high frequency counter counts complete cycles of the input clock until it asserts the desired clock signal, (2) one output is selected from a tapped delay line to generate the desired clock signal based on the measured phase error, or (3) a combination of a tapped delay line and a counter is used for both course and fine tuning of the phase shift, respectively.

Using a counter requires an internal clock with a frequency that is much higher than the input signal rate. The limits on the frequency of the internal clock define the input frequency limits (typically on the order of tenths of Hz). Thus, the use of this type of PLL is restricted to low rate applications such as subcarrier demodulation or, alternatively, requires a very high frequency clock (up to 300 MHz is reported using ECL technology).

In a conventional tapped delay line PLL, the resolution of the delay line is too low for effective use in many current applications.

SUMMARY OF THE INVENTION

The present invention provides a digital phase-locked loop that utilizes a tapped delay line, one output of which is selected by selection logic to provide an output clock signal. The output clock signal is phase-compared with the input signal (either a clock signal or a NRZ data signal) which is a signal with a frequency that is a division-by-two of the frequency of the internal oscillator. The source of the input signal is also the internal oscillator.

In a preferred embodiment of the present invention, the PLL is used in a fax machine application and is part of a system chip that is phase synchronized to the fax machine's microprocessor clock. The internal oscillator is both the source of the system chip's clock, which is the output of the PLL, and the source of the microprocessor's clock. A decision is then made, according to the phase detection, whether to select the next output of the tapped delay line, the previous output, or remain with the current output. Therefore, if a change in frequency is needed (as in fax applications where a different frequency is required), then, if an integer multiple or division of the original frequency is selected for the internal oscillator, the synchronization will be unchanged. Furthermore, both the output clock and the input signal simultaneously switch to the new frequency. These operations are performed by logic that enables smooth switching to the new frequency only after an entire cycle of the low frequency. As a result of the high resolution of the taps in the delay line, the delta delay of each tap being 1 nsec., high resolution of synchronization is achieved and a low jitter of 0.5 nsec. is possible. Under normal operating conditions, as discussed in greater detail below, the actual jitter is zero.

The entire PLL module operates without a Reset signal, i.e. it synchronizes itself independently. Thus, when the chip is exiting reset, synchronization is guaranteed. A special mechanism cancels the need for initializing the counter, state machines, dividers, etc. to known values, which usually is done using a Reset signal.

Other features and advantages of the present invention will become apparent and be appreciated by reference to the following detailed description of the invention which should be considered in conjunction with the accompanying drawings.

A DETAILED DESCRIPTION OF THE INVENTION

Figure 1:
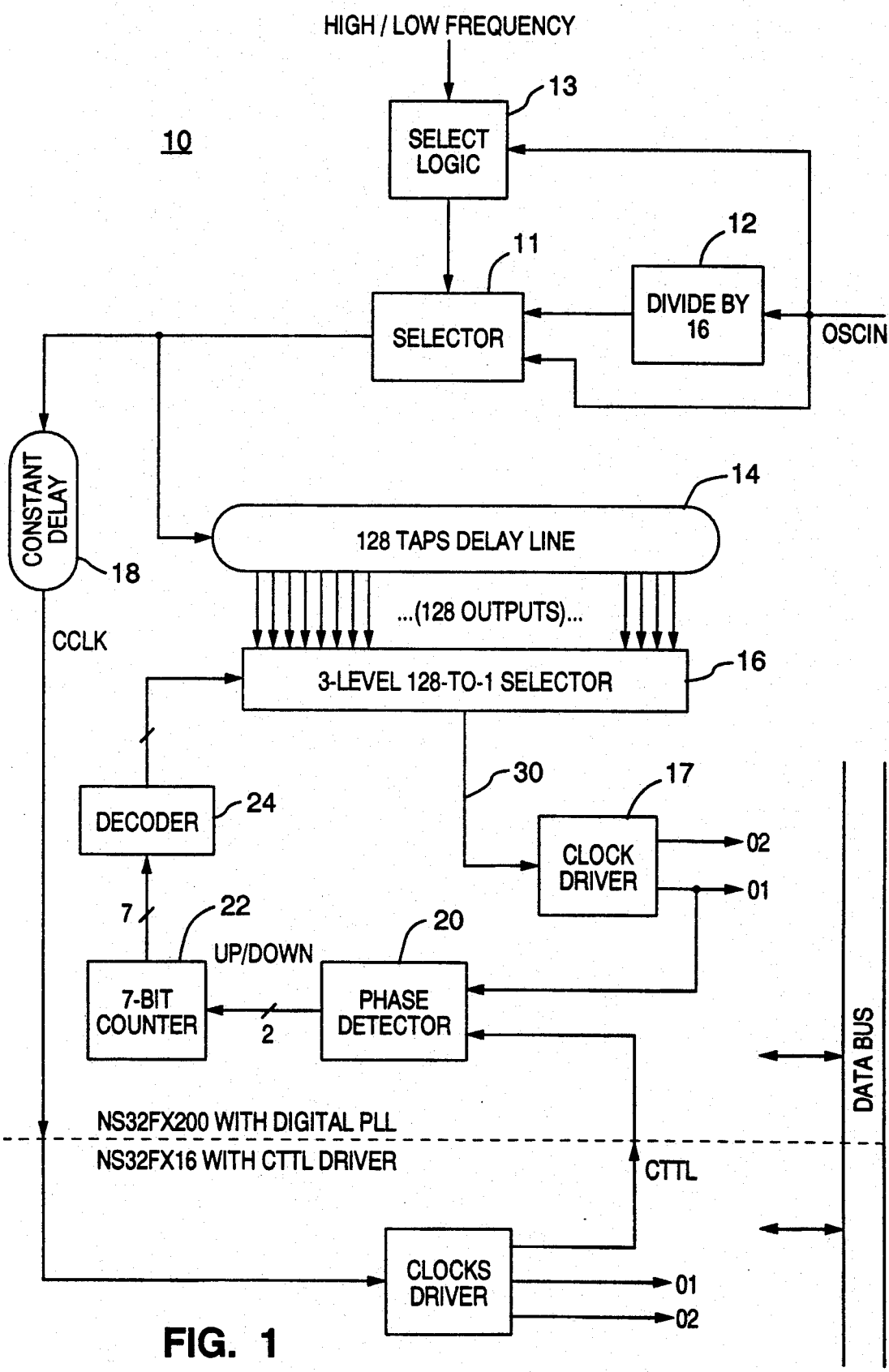
FIG. 1 is a block diagram illustrating a multi-frequency digital phase-locked loop in accordance with the present invention.

FIG. 1 shows a general block diagram of a phase-locked loop 10 in accordance with the present invention.

As shown in FIG. 1, an external clock signal OSCIN from a double frequency oscillator (not shown) feeds divide-by-16 logic 12. The output of the divide-by-16 logic 12 is provided to a 2-to-1 selector 11 which selects between the original double frequency clock OSCIN and the same clock after division by 16. The select input to the 2-to-1 selector 11 is synchronized by select logic 13 in a way that it enables actual switching between the original low frequency clock OSCIN and the divide-by-16, high frequency clock only after a low frequency cycle has ended.

The output of the 2-to-1 selector 11 is fed to a high resolution tapped delay line 14 which delays the clock edges by taps of 1 nsec. Selector logic 16 selects one of the 128 consequent outputs of the tapped delay line 14. Clock driver 17 buffers the selected output, divides frequency by two and generates a two-phase, non-overlapping clock ($\phi 1/\phi 2$).

Figure 5:
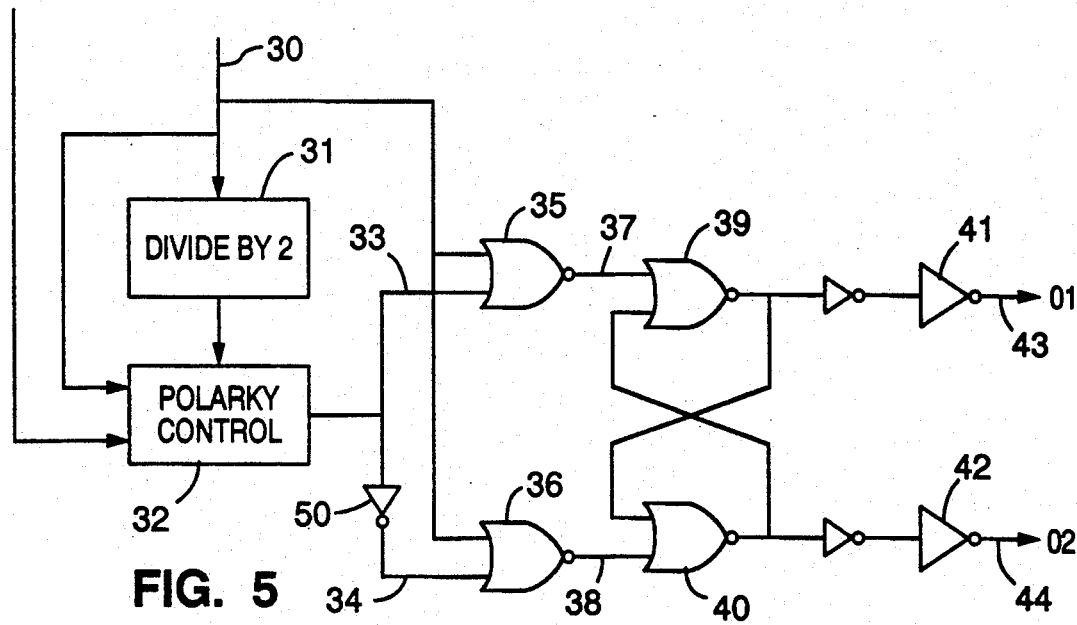
FIG. 5 is a combination block diagram-logic diagram illustrating a clock driver utilizable in conjunction with the FIG. 1 digital phase-locked loop.

More specifically, as shown in FIG. 5, the selected output 30 of the delay line 14, is buffered, its frequency is divided by 2 by logic 31, and its polarity is selected by polarity control logic 32. Two signals are then generated: selected output divided-by-2 33 and selected output divided-by-2 inverted 34. Two NOR gates 35 and 36 are used to compensate for the delay at invertor 50 and to produce two symmetric signals 37 and 38. Signals 37 and 38 are fed into two cross-coupled NOR gates 39 and 40 that are configured to generate a non-overlap period between the phases. Drivers 41 and 42 then buffer the NOR gate outputs to produce the two symmetric, non-overlapping phases $\phi 1$ and $\phi 2$.

Figure 6:
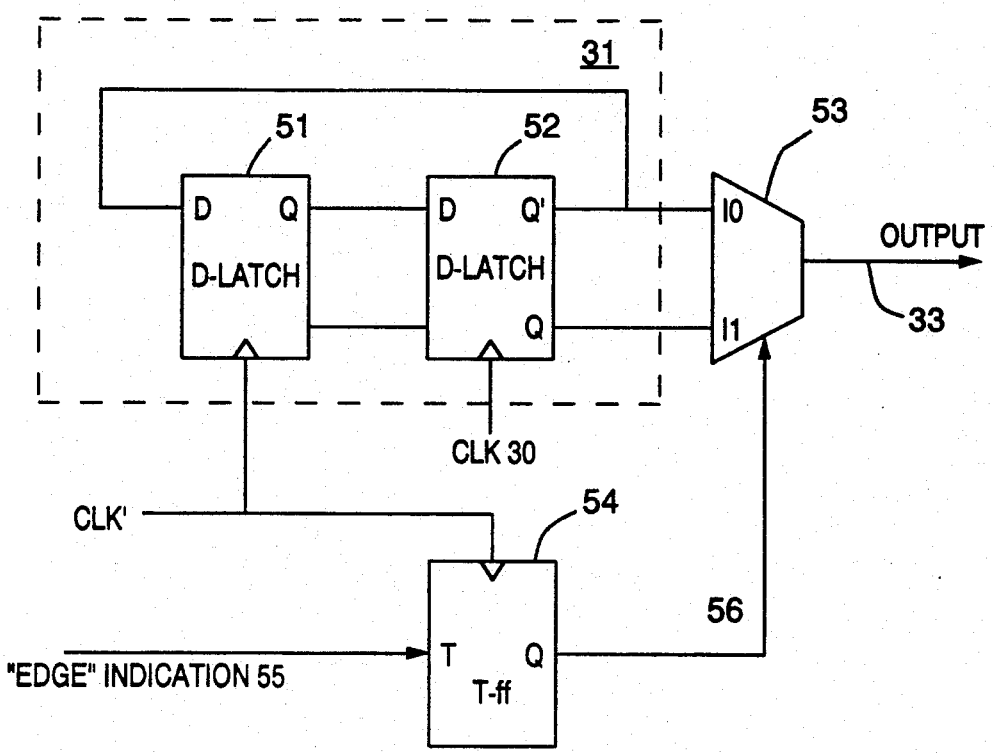
FIG. 6 is a block diagram illustrating polarity inversion logic utilizable in conjunction with FIG. 1 digital phase-locked loop.

The divide-by-two logic 31 and polarity control logic 32 are shown in greater detail in FIG. 6.

Referring back to FIG. 1, the output of selector 11 is also delayed by constant delay logic 18 and the resulting delayed clock signal CCLK is output from the chip including the PLL 10 to an external component that is the source of a system clock CTTL. System clock CTTL is directly generated from delayed clock signal CCLK by dividing it by two. The system clock CTTL is then re-input to the phase detector 20 of PLL 10 for phase comparison with the generated clock $\phi 1$.

As a result of the PLL operation, clock $\phi 1$ is synchronized to system clock CTTL such that the skew between them is in the range of 0-4 nsec. In a number of microprocessor applications, for example the National Semiconductor Corporation NS32FX16 microprocessor, clock $\phi 1$ to system clock CTTL skew is in the range of 1-4 nsec. Therefore, the internal clocks of both chips are synchronized to each other accurately enough for both chips to be able to share the same bus.

Phase detector 20 is a conventional digital phase detector that samples the system clock CTTL by clock $\phi 1$. Actually, because of implementation considerations, system clock CTTL is the signal that samples clock $\phi 1$. The phase detector 20 then provides a 2-bit up/down digital signal that indicates the activity to be performed: i.e. count upwards, count downwards or remain in the same place.

Figure 7:
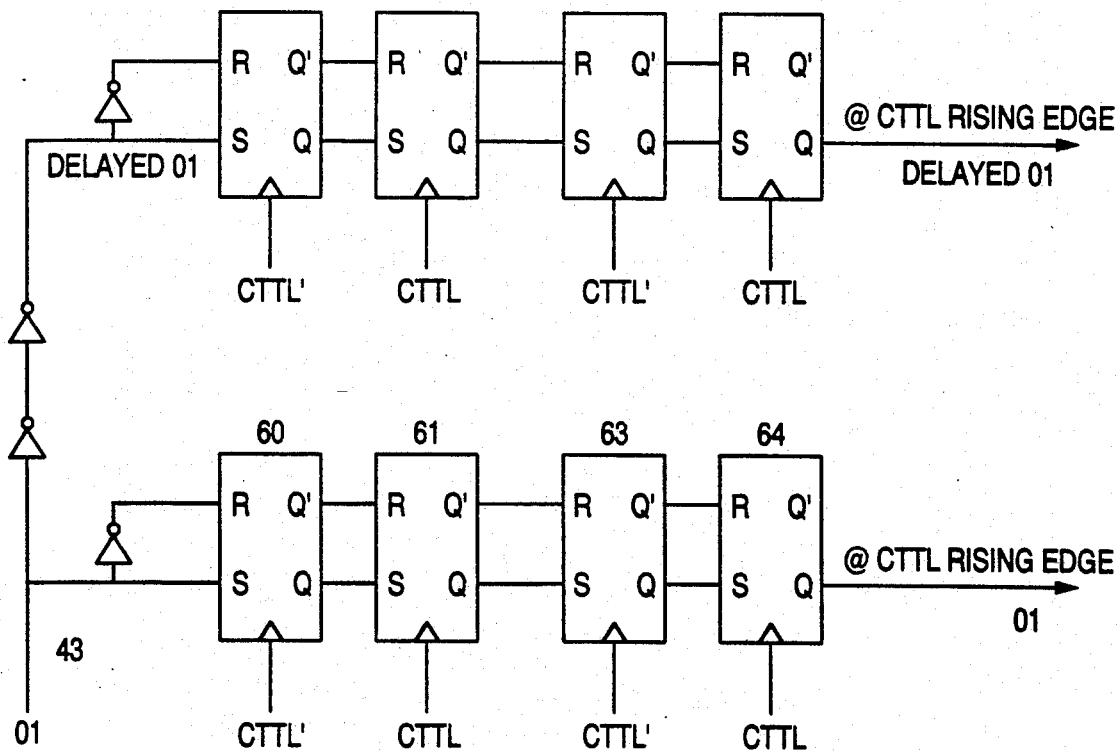
FIG. 7 is a block diagram illustrating a phase detector utilizable in conjunction with the FIG. 1 digital phase-locked loop.

The phase detector logic 20 is shown in greater detail in FIG. 7.

The up/down output signal of the phase detector 20 is the input, after some logic translations, to a 7-bit counter 22 that holds a binary value that corresponds to the index of the output of the delay line 14 which should be selected in order to generate clock $\phi 1$. Logically, the "carry-in" input of the 7-bit counter 22 equals the OR of "up" and "down" signals (carry in = "up" + "down"). The "increment/decrement" input of the 7-bit counter equals the "up" signal (if "up" then increment, else decrement). Conventional logic is also provided to synchronize the signals to their corresponding clocks using timing considerations.

After decoder 24 decodes the output value of counter 22, a 128-to-1 selection is performed by selector logic 16. The selected output is then used to generate the two phases $\phi 1/\phi 2$, the first of which is fed back to the phase detector 20, as described above.

Those skilled in the art will appreciate that special care should be taken to assure equal delay in all 128 paths of the selector logic 16 since this parameter is most important for the stability of the synchronization point.

Figure 2:
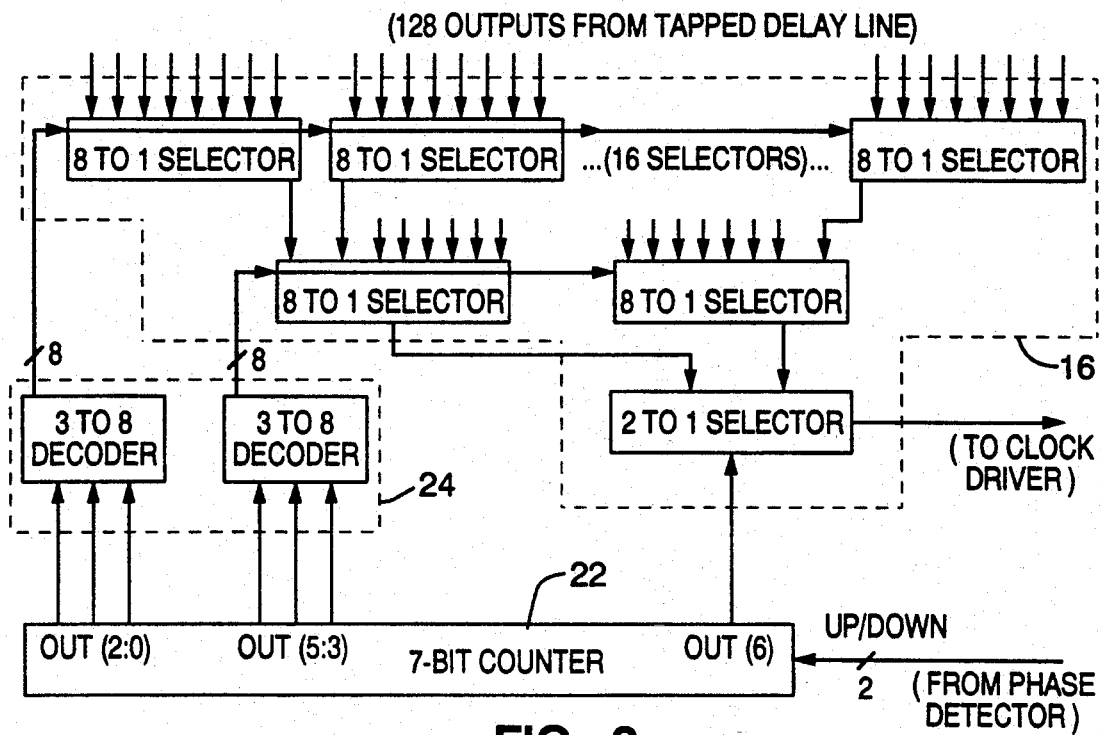
FIG. 2 is a block diagram illustrating a three-level 128-to-1 selector, 7-bit counter and decoder combination utilizable in the FIG. 1 digital phase-locked loop.

FIG. 2 shows the three level 128-to-1 selector logic 16, 7-bit counter 22 and decoder 24 combination in greater detail.

Referring back to FIG. 1, as stated above, the input to the delay line 14 is the origin for both the clock $\phi 1$ and the system clock CTTL. Therefore, when switching between frequencies, which is only done upon rising edges of the low frequency clock, smooth passes are guaranteed. Furthermore, if synchronization has been achieved prior to switching, then there should be no indication of a change in phase relations between clock $\phi 1$ and system clock CTTL after the actual frequency switching has been performed.

Figure 3:
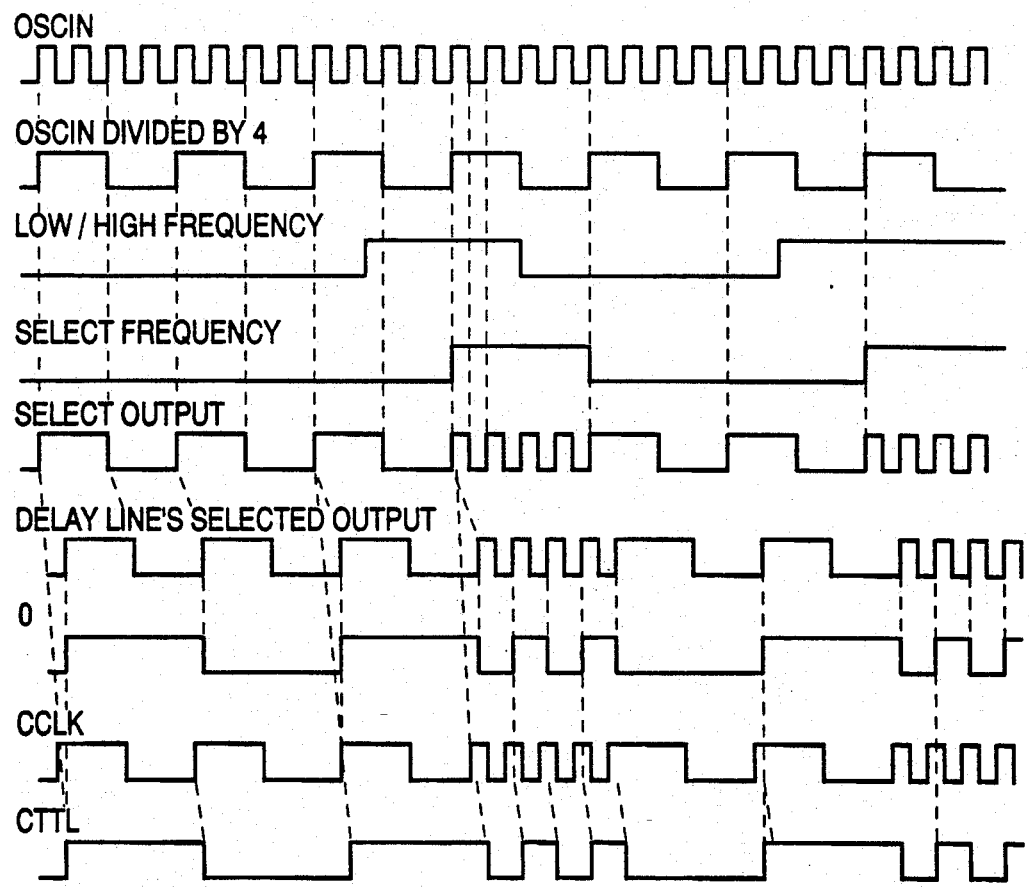
FIG. 3 is a timing diagram illustrating waveforms for frequency switching and phase detector indications utilizing the FIG. 1 digital phase-locked loop.

FIG. 3 provides a timing diagram of an illustrative frequency-switching sequence. A divide-by-4 is shown, rather than a divide-by-16 as described above, in order to simplify the diagram. In FIG. 3, dotted lines represent a functional sequence with delay; dashes represent the unchanged skew between clock $\phi 1$ and system clock CTTL.

As shown in FIG. 3, the switching from an initial low frequency is simpler than the case when the initial frequency is high. This is because, in the latter case, synchronization between clock $\phi 1$ and system clock CTTL can be done on any rising edge of the high frequency clock. However, only one out of 16 of the rising edges of the high frequency clock is suitable for synchronization to the low frequency. Thus, the initial frequency must be the lower one. If a high frequency is required as the initial frequency, then the module should be started with the low frequency and, after synchronization has been achieved, it should automatically switch to the high frequency. In the embodiment described herein, however, the initial frequency is always the lower one. Therefore, the implementation is simpler.

In the illustrated design, the PLL 10 must synchronize the clock $\phi 1$ to the system clock CTTL during reset. This means that reset cannot be used by the PLL 10 as an input to initialize either counter values, or the polarity of clock $\phi 1$ (after division by two), or any state machine inside the PLL 10. Therefore, the whole module operates under the constraint of an all random-initialized logic starting up at unknown values.

This is accomplished as follows. First, the counter value, the clock $\phi 1$ polarity and state machines are initialized to random values. Second, the initial phase detection is done, yielding an up/down value. Third, the counter 22 counts upwards or downwards, producing the selected output index incremented or decremented, respectively. Fourth, when the initial frequency is high enough that the delay of delay line 14 is greater than half a clock cycle, the PLL 10 will always achieve synchronization independent of the starting polarity of clock $\phi 1$. Fifth, in the case that the initial frequency is low enough, such that the whole delay line 14 provides smaller delay than half a clock cycle, then there is one, and only one, location in the delay line 14 where the PLL 10 is able to establish synchronization, provided that clock $\phi 1$ had been invoked at the correct polarity. Otherwise, there is no such location.

Therefore, if clock $\phi 1$ had been correctly invoked, then the counter 22 proceeds toward synchronization in the correct location; otherwise, it goes in the opposite direction until the edge of the delay line 14 would be reached. In the latter case, special logic inverts the polarity of clock $\phi 1$ necessarily causing the phase detector 20 to indicate the contrary and the counter 22 to count the other way. Thus, synchronization is guaranteed.

FIG. 6 shows the logic that inverts the polarity of clock $\phi1$ when an edge of the delay line 14 is reached. D-latches 51 and 52 provide the divide-by-2 logic 31 in FIG. 5. The select signal 56 is used to select the polarity of the divided signal by selector/multiplexor 53. If the "edge" indication signal 55 indicating that an edge of the delay line has been reached is true, then, at the next falling edge of the CLK signal 30, the select signal 56 is inverted and, thus, the polarity of output 33 is inverted.

As described above, the system clock CTTL samples the two clock signals $\phi1$ and delayed $\phi1$. As shown in FIG. 7, due to the fact that the sample clock CTTL and clock $\phi1$ are initially asynchronous, and furthermore, they, during normal operation, sample each other exactly at the most dangerous moment, in terms of mean time between failures (MTBF) problems, special care has been taken to construct the phase detector 20 using SR-flip/flops in such a way that ensures an MTBF that is large enough at the operating frequency.

As shown in the FIG. 7 block diagram of the phase detector 20, clock $\phi1$ sets (if $\phi1=$"1") or resets (otherwise) the first SR-flip/flop 60 with the falling edge of the system clock CTTL. Together with the second SR-flip/flop 61, it resembles an edge-triggered sampler, the output 62 of which indicates the status of clock $\phi1$ at the rising edge of system clock CTTL. The third and fourth SR-flip/flops 63 and 64, respectively, resemble another edge-triggered sampler for better MTBF. The same type of logic, i.e. SR-flip/flops 66–69, is used to sample the delayed clock $\phi1$ 65, which is the clock $\phi1$ delayed by 1.5 nsec. to provide the phase detector window.

Table I below provides a truth table for the phase detector 20.

TABLE I

| | Phase Detector Truth Table | | |
|---|---|---|---|
| $\phi1$ @ CTTL rising edge | delayed $\phi1$ @ CTTL rising edge | "up" | "down" |
| 0 | 0 | 0 | 1 |
| 0 | 1 | 1 | 0 |
| 1 | 0 | 0 | 0 |
| 1 | 1 | 1 | 0 |

Figure 4:
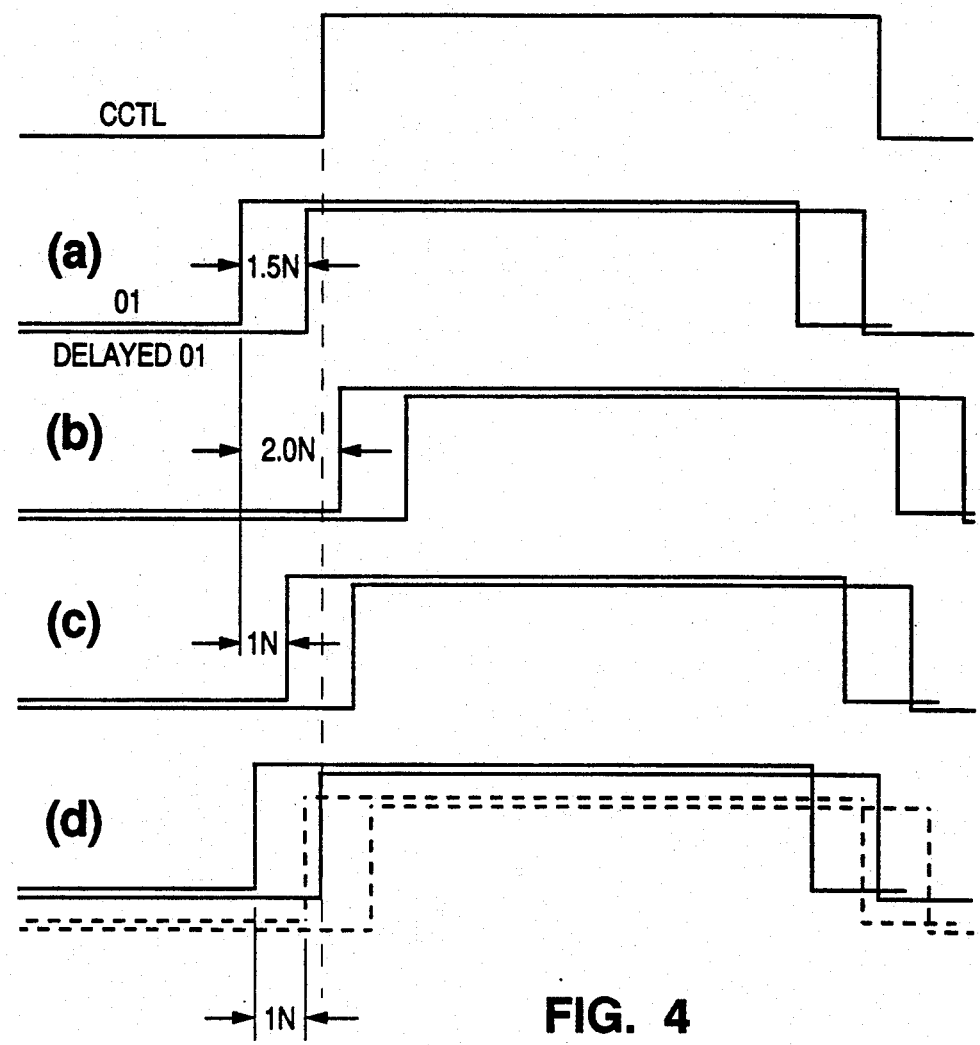
FIG. 4 is a timing diagram illustrating a phase detector window for the FIG. 1 digital phase-locked loop.

FIG. 4 illustrates the phase detector window. Line (a) in FIG. 4 shows the case when clock $\phi1$ is too early relative to system cock CTTL. In this case both clock $\phi1$ and delayed $\phi1$ are sampled "1" by the rising edge of the system clock CTTL. Line (b) in FIG. 4 shows the case when clock $\phi1$ is too late. In this case, both clock $\phi1$ and delayed $\phi1$ are sampled "0". Line (c) in FIG. 4 shows the case when clock $\phi1$ is in the correct phase relative to system clock CTTL. In this case, clock $\phi1$ is sampled "1", while delayed $\phi1$ is sampled "0". Line (d) in FIG. 4 shows an edge case when delayed $\phi1$ rises exactly with system clock CTTL. In this case, if it rises a little earlier, then it will be sampled "1" and a "shift right" indication will occur. Thus, clock $\phi1$ and delayed $\phi1$ will be shifted one nsec, which is equal to one tap delay 37 upwards", as indicated by the dash lines in line (d). Also, system clock CTTL rising edge will still remain within the window, since the width of the window is larger, i.e. 1.5 nsec. Therefore, theoretically, there will be no jitter around this point.

Even if the window mechanism does not work properly in the case shown in line (d) of FIG. 4 and the counter 22 counts up and down endlessly, clock $\phi1$ will only be shifted back and forth by 1 nsec. Therefore, the maximum jitter will be plus/minus 0.5 nsec.

In reality, jitter greater than zero will occur only at the extreme condition of noise on the voltage supply that is higher than 50 mV, that would occur at a frequency that is lower than the operating frequency of the chip. Typical noise on conventional voltage supplies is $-70$ dB, which corresponds to 0.5 mV peak-to-peak at the relevant frequencies. Therefore, it may be stated that under all possible working conditions, effectively, the jitter of the PLL 10 is zero.

After synchronization has been achieved, a small drift can occur due to changes in the voltage supply, ambient temperature, etc. As described above, the PLL 10 is dynamically able to correct phase errors that occur during chip operation. However, if synchronization had been achieved very close to any of the delay line edges, and the drift is in the direction of the dead end of the delay line 14, an overflow will occur in the counter 22. The operating signals of the counter increment/decrement, carry/in, etc. are designed to stop counting when the edge is reached. In this case, clock $\phi1$ would invert its polarity, as described earlier, and the whole synchronization would be lost.

In order to prevent this fatal event, two precautions have been taken. First, in order not to synchronize at the far end of the delay line 14, the delay line 14 is long enough such that in the worst case, with the chip on which the PLL 10 is integrated is a fast chip, and the system clock source is a slow chip, the delay provided by the delay line 14 is large enough to achieve synchronization far from the edge of the delay line, provided that the polarity of clock $\phi1$ is the correct one. Second, in order not to synchronize at the beginning edge of the delay line 14, signal CCLK that is the output of the chip to the source of system clock CTTL is also delayed by a fixed delay. Thus, the system clock rising edge is constantly delayed such that in the opposite worst case, (PLLs chip is slow, CTTLs source is fast), the synchronization location will not be at the very beginning of the delay line 14.

It should be understood that various alternatives to the structures described herein may be employed in practicing the invention. It is intended that the following claims define the invention and that structures and methods within the scope of these claims and their equivalents be covered thereby.

What is claimed:
1. A multi-frequency digital phase-locked loop comprising:
 (a) input selector means for providing either a first clock signal or a second clock signal having a frequency higher than the first clock signal as a selector means clock output signal;
 (b) a tapped delay line responsive to the selector means clock output signal for providing a plurality of tapped delay line clock output signals having an equally-spaced phase relationship;
 (c) selector logic means responsive to a select input signal for selecting one of the plurality of tapped delay line clock output signals as a selected tapped delay line clock output signal;
 (d) clock driver means responsive to the selected tapped delay line clock output signal for generating first and second symmetric phase clock signals;

(e) constant delay means responsive to the selector means clock output signal for generating a delayed clock signal, the delayed clock signal utilizable for generating a system clock signal;

(f) phase detector means for comparing the system clock signal and the first phase clock signal to provide an up/down phase detector output signal;

(g) counter means responsive to the up/down phase detector output signal for providing a count value corresponding to one of the plurality of tapped delay line clock output signals; and (h) decoder means responsive to the count value provided by the counter means for providing a corresponding decoder output signal as the select input signal to the selector logic means whereby the first phase clock signal and the system clock signal are synchronized.

2. A multi-frequency digital phase-locked loop as in claim 1 and further including means for switching the selector means clock output signal between the first clock signal and the second clock signal without losing synchronization between the first phase clock signal and the system clock signal.

3. A multi-frequency digital phase-locked loop as in claim 2 and further including jitter control means for generating a phase detector window whereby substantially zero jitter on the phase clock signal is obtained.

4. A multi-frequency digital phase-locked loop as in claim 1 wherein equally-spaced phase relationship of the plurality of tapped delay line clock output signals is about 1 nsec. or less.

5. A multi-frequency digital phase-locked loop as in claim 1 which is included in a system responsive to a reset signal, and further including means for synchronizing the first phase clock signal and the system clock signal when the reset signal is active.

6. A multi-frequency digital phase-locked loop as in claim 5 and further including means for inverting the polarity of the first phase clock signal such that synchronization between the first phase clock signal and the system clock is maintained in the event that the polarity of the first phase clock signal cannot be predetermined when the reset signal is active.

* * * * *